US009908819B1

(12) United States Patent
Kollenberg

(10) Patent No.: US 9,908,819 B1
(45) Date of Patent: Mar. 6, 2018

(54) PRINTING METHOD FOR PRODUCTION A CERAMIC GREEN BODY

(71) Applicant: WZR Ceramic Solutions GmbH, Rheinbach (DE)

(72) Inventor: Wolfgang Kollenberg, Deutschland (DE)

(73) Assignee: WZR CERAMIC SOLUTIONS GMBH, Rheinbach (DE)

( * ) Notice: Subject to any disclaimer, the term of this patent is extended or adjusted under 35 U.S.C. 154(b) by 163 days.

(21) Appl. No.: 14/440,036

(22) PCT Filed: Oct. 30, 2013

(86) PCT No.: PCT/EP2013/072696
§ 371 (c)(1),
(2) Date: Apr. 30, 2015

(87) PCT Pub. No.: WO2014/067990
PCT Pub. Date: May 8, 2014

(30) Foreign Application Priority Data

Oct. 31, 2012 (DE) .................. 10 2012 219 989

(51) Int. Cl.
C04B 35/622 (2006.01)
C04B 35/626 (2006.01)
C04B 35/632 (2006.01)
C04B 35/636 (2006.01)
C04B 35/638 (2006.01)
C04B 35/117 (2006.01)
C04B 35/119 (2006.01)
A61C 13/00 (2006.01)
B28B 1/00 (2006.01)
B29C 67/00 (2017.01)
H05K 3/12 (2006.01)
C04B 35/00 (2006.01)
C04B 35/64 (2006.01)
C04B 35/628 (2006.01)
C04B 35/63 (2006.01)
C04B 35/634 (2006.01)
B05D 1/26 (2006.01)
B05D 1/40 (2006.01)
B05D 3/02 (2006.01)
B05D 7/24 (2006.01)
H05K 3/00 (2006.01)
H05K 3/46 (2006.01)
(Continued)

(52) U.S. Cl.
CPC ............ C04B 35/6325 (2013.01); B05D 1/26 (2013.01); B05D 1/40 (2013.01); B05D 3/0254 (2013.01); B05D 7/24 (2013.01); B28B 1/001 (2013.01); C04B 35/00 (2013.01); C04B 35/622 (2013.01); C04B 35/626 (2013.01); C04B 35/628 (2013.01); C04B 35/62886 (2013.01); C04B 35/63 (2013.01); C04B 35/632 (2013.01); C04B 35/634 (2013.01); C04B 35/638 (2013.01); C04B 35/63416 (2013.01); C04B 35/64 (2013.01); B05D 2203/30 (2013.01); B05D 2350/63 (2013.01); B05D 2401/10 (2013.01); B05D 2401/20 (2013.01); B05D 2401/21 (2013.01); B33Y 10/00 (2014.12); B33Y 80/00 (2014.12)

(58) Field of Classification Search
CPC ... C04B 35/622; C04B 35/626; C04B 35/628; C04B 35/62886; C04B 35/63; C04B 35/632; C04B 35/6325; C04B 35/634; C04B 35/63416; C04B 35/64; B28B 1/001; B05D 1/26; B05D 1/40; B05D 3/0254; B05D 7/24; B05D 2203/30; B05D 2350/63; B05D 2401/10; B05D 2401/20; B05D 2401/21
USPC .................. 264/29.1, 603, 624, 669, 670
See application file for complete search history.

(56) References Cited

U.S. PATENT DOCUMENTS 8,133,831 B2 * 3/2012 Laubersheimer ......... B28B 1/00
264/16
2005/0087903 A1 4/2005 Farr et al.
(Continued)

FOREIGN PATENT DOCUMENTS

CN 1810492 A 8/2006
CN 102274544 A 12/2011
(Continued)

OTHER PUBLICATIONS

Vilardell M et al.: "Ink Jet Printing for Functional Ceramic Coatings", Journal of Imaging Science and Technology, SPIE—The International Society for Optical Engineering, US, vol. 55, No. 4, Jul. 1, 2011, pp. 40304-1-40304-7, XP008166337.
Melcher R et al.: "Kap. 3.4.2.4 Herstellung keramisch-metallischer Formkoerper durch 3D-Drucken", Technische Keramische Werkstoffe, DKG / Deutscher Wirtschaftsdienst, HVB-Verlag, DE No. 96. Ergaenzungslieferung Jan. 2007, pp. 1-16, XP008166328 (abstract).
(Continued)

Primary Examiner — William P Fletcher, III
(74) Attorney, Agent, or Firm — Knobbe Martens Olson and Bear, LLP

(57) ABSTRACT

A method for producing a green body includes forming a layer which contains a powder of a ceramic on a substrate, applying at least one solidifying composition on at least a part of the layer, repeating forming the layer and applying at least one solidifying composition at least one time, removing the solvent or dispersing agent at least in part for forming a green body, and removing the powder which has not bonded and thereby exposing the green body. The solidifying composition contains a dissolved or liquid organometallic compound, which has at least one atom other than C, Si, H, O, or N bonded to at least one organic moiety, an organic binding agent, and a solvent or dispersing agent.

9 Claims, No Drawings

(51) Int. Cl.
    *B33Y 10/00*        (2015.01)
    *B33Y 80/00*        (2015.01)

(56)            References Cited

U.S. PATENT DOCUMENTS

2006/0251535  A1   11/2006   Pfeifer et al.
2006/0251826  A1   11/2006   Pfeifer et al.
2007/0267766  A1   11/2007   Hesse et al.
2010/0040767  A1    2/2010   Uibel et al.
2010/0249305  A1    9/2010   Laubersheimer et al.

FOREIGN PATENT DOCUMENTS

DE          103 06 887 A1     8/2004
DE       10 2004 008122 A1    9/2004
DE       20 2005 020 596 U1   6/2006
DE          602 07 204 T2     7/2006
DE       10 2005 058 116 A1   3/2007
DE       10 2005 058 121 A1   3/2007
DE       10 2005 058 118 A1   6/2007
DE       10 2006 015 014 A1   10/2007
DE       10 2006 029 298 A1   12/2007
DE       10 2008 022664 A1    11/2009
DE         102008022664 A1 *  12/2009
DE       10 2011 117 005 A1   4/2013
EP           0 431 924 B1     1/1996
EP           1 360 063 B1     11/2003
EP           2 233 449 A1     9/2010
JP           2003-507120 A    2/2003
JP           2003-201181 A    7/2003
JP           2005-132111 A    5/2005
JP           2006-517856 A    8/2006
JP           2006-521264 A    9/2006
JP           2010-227581 A    10/2010
WO            01/13814 A1     3/2001

OTHER PUBLICATIONS

International Search Report of PCT/EP2013072696 dated Feb. 4, 2014 in 6 pages.
Office Action for German Patent Application DE102012219989.6 dated Jun. 14, 2013 in 8 pages.
Chinese Office Action dated Jan. 28, 2016 of corresponding Chinese Patent Application No. 201380056059.6—16 pages.
Office Action dated Aug. 1, 2017 in corresponding Japanese Patent Application No. 2015-540110—4 pages.

* cited by examiner

PRINTING METHOD FOR PRODUCTION A CERAMIC GREEN BODY

FIELD

The present invention relates to a method for the production of a ceramic green body, a method for the production of a ceramic mold, as well as the green body and the ceramic mold themselves.

DESCRIPTION OF RELATED ART

The effort required for the development of ceramic components can be significantly reduced by the rapid provision of prototypes. It is possible to immediately convert design changes into components—now abandoned for example based on CAD—without needing to change tools.

The term "rapid prototyping" indicates the rapid production of prototypes, and refers to a technology which has been suitable, since the beginning of the 1990s, for generative manufacturing processes, due to constantly continuing development with powerful, computer-based control and regulation technology. The term "rapid prototyping" includes concepts such as "rapid tooling" and "rapid manufacturing." These refer to continued development of the actual processes which describe the special applications and usage domains. The term "rapid prototyping" indicates, in general, the technology, whereas "rapid tooling" indicates the generative construction of tools as the domain of application, and the term "rapid manufacturing" indicates generative series production.

The rapid prototyping method is part of the state of the art in the metal industry, and particularly in the plastics industry. As a result, it is typically possible to produce components directly from 3D CAD data. It is possible to create highly complex and detailed structures in a cost-effective manner within a few hours. In this way, it is possible to reduce the time and the cost of development significantly; the time until new components are introduced on the market is also significantly shortened.

SUMMARY

At present, ceramic materials still have the fundamental problem that their potential is not sufficiently known in engineering and construction processes. For this reason, the use of very fast, computer-based methods in the manufacture of prototypes is particularly interesting for this group of materials.

The as-of-yet relatively long and cost-intensive production process, including model development, mold assembly, optimization of the working concept, preparation of the raw materials, shaping, sintering, and post-processing, generally leads to lengthy development cycles. For producers and users, a method is needed for the rapid and cost-effective provision of the prototypes.

Various methods can be utilized to realize time-saving, cost-effective prototype production. In addition to the known green processing methods, there is also research work particularly into the areas of laser sintering, hot casting, and 3D printing.

Methods have also been presented which make it possible to generate prototypes from ceramic materials within short periods of time (5-10 days). The prototypes are supposed to have the corresponding properties of the later mass produced product.

DE 103 06 887 A7 describes a method for the production of a ceramic green body, wherein particles of ceramic powder can be given a coating which contains different kinds of nanoparticles.

DE 10 2006 029 298 A1 describes a material system for 3D printing, wherein the described method can also lead to a ceramic mold.

DE 20 2005 020 596 U1 describes a powder for rapid prototyping, wherein a ceramic mold is created by laser sintering.

DE 10 2005 058 118 A1 describes a method for the production of ceramic components, wherein the ceramic components are created by laser sintering.

DE 10 2005 058 116 A1 describes a method for the production of ceramic implants, wherein the ceramic implants are locally cured by means of a laser.

DE 10 2006 015 014 A1 describes a method and a device three-dimensional ceramic mold, wherein a suspension of ceramic particles is printed with an ink jet printer.

DE 10 2005 058 121 A1 describes a method for the production of ceramic components, wherein the green body can be locally cured by means of a laser.

DE 602 07 204 T2 describes three-dimensionally structured printing for the purpose of producing polymer bodies. Nanoparticles can also be incorporated into these polymer bodies.

DE 10 2004 008 122 A1 describes coating powder particles for the production of three-dimensional bodies by means of layering methods, wherein the powder particles can be coated.

EP 0 431 924 A2 describes a method wherein binding agent is applied to ceramic powder.

DE 10 2008 022 664 A1 describes a printing method for ceramic components.

The article "Herstellung keramisch-metallischer Formkörper durch 3D Drucken" [Production of ceramic-metallic molds using 3D printing] (Melcher et al., Keramische Werkstoffe, January 2007, 3.4.2.4.) describes printed aluminum oxide dextrin green bodies and ceramic molds created from the same.

The methods known to date have various disadvantages. By way of example, in some methods, the ceramic material which makes up the later ceramic mold is printed in a suspension. This requires a high solid concentration in the suspension being printed, which thereby clogs the printing nozzles. It is not possible using the methods named above to vary the properties of the resulting ceramic mold beyond the spatial dimensions of the ceramic mold.

Although the practice of adding additional particles to the ceramic powder is already known, this is performed to date, by way of example, by coating the ceramic article, and then printing, to produce the green body. In this way it is possible to imbue the ceramic mold with properties which are not generated by the originally used ceramic powder. However, it is not possible to generate these properties in such a manner that they have different features at different points on the mold. In addition, to date, a difficult coating method is necessary for the ceramic particles in this case.

The problem addressed by the present invention is therefore that of providing a simple method by means of which it is possible to give a ceramic mold a particular property independently of the ceramic material originally used.

DETAILED DESCRIPTION

This problem addressed by the invention is solved in a first embodiment by a method for the production of the green body, wherein a) a layer which contains a ceramic, ceramic glass, or glass powder is formed on a substrate, b) at least one solidifying composition is applied to the abovementioned layer, on at least a part thereof, which contains at least 0.01 to 99.98% by weight of a dissolved or liquid organoelement compound, wherein the same has at least one atom which is not C, Si, H, O, or N, and this atom is bonded to at least one organic moiety, contains 0.01 to 20% by weight of an organic binder, and contains 0.01 to 99.98% by weight of solvent or dispersing agent, c) steps a) and b) are repeated at least one time, d) the solvent or dispersing agent is at least partially, or completely, removed, forming a green body, and e) the ceramic powder which has not bonded is removed, wherein the green body is exposed.

An aspect to the invention is to provide a generative method wherein new molds or green bodies are created rather than material being processed.

Dispersing agents in the context of the invention are liquid phases of the dispersion in the case, by way of example, where the solidifying composition is a colloidal suspension.

An advantage of according to an embodiment the invention is, particularly compared to DE 10 2008 022 664 A1, that the printing heads of the printer used are no longer clogged by the nanoparticles used to date, and it is possible to achieve a substantially more homogeneous coloring of the product.

If a thermal treatment is added, the organoelement compound is converted into inorganic metallic or non-metallic compounds, by way of example. It is possible in this way to influence properties such as color, strength, hardness, electrical conductivity, heat conductivity, thermal expansion, magnetic properties, piezo-electric properties, inductive properties, capacitive properties, or optical properties with locational accuracy.

Additional advantages are that it is possible with this approach to realize properties of profiles, jumps, or gradients which are desired for aesthetic or technical reasons, in any manner desired.

The layer in step a) can preferably also include binding agent.

The solidifying composition can also contain 0.1 to 99.9% by weight of dispersing agent as a solvent. The dispersing agent can therefore also be selected from among the suggested solvents.

Following steps c) and d), it may be preferred to remove any dispersing agent or solvent, at least partially, or completely, to form a green body.

The solidifying composition can also contain 0.1 to 99.9% by weight of a colloidal dispersion with an average diameter of the dispersed phases in a range below 5 nm, and can also contain dispersing agent. The dispersing agent can be identical to the solvent.

The dispersing agent or solvent is preferably selected from the group containing alcohols, glycols, ethers, glycol ethers, acetates, ethanol, dimethylformamide, toluene, methanol, chlorobenzene, diethylformamide, dimethyl sulfoxide, water, hydrogen peroxide, methyl amine, sodium hydroxide, N-methylpolidone ether, acetonitrile, methyl cyanide, ethane nitrile, acetonitrile, acetic acid nitrile, ethyl nitrile, cyanomethane, benzyl chloride, triethylamine, ethylene glycol, tetrahydrofuran (THF), tetramethylene oxide, 1,4-epoxybutane, oxacyclopentane, oxolane, acetophenone, anisole, benzyl alcohol, butyl acetate, cyclohexanol, 1,4-dioxane, dimethylacetamide, n-dodecane, ethylbenzene, diethyleneglycol, hexylbenzene, hexyl iodide, methyl benzoate, N-methyl-pyrrolidone, 1-octanol, 1,3-propanediol, propylene carbonate, p-xylene, diethylene glycol monobutyl ether, diethylene glycol monobutyl ether acetate, ethylene glycol monobutyl ether, diiodomethane, ethylene glycol monophenyl ether, terpineol, and/or tetradecane, or combinations thereof.

Dispersing agents in an aspect of the invention are the liquid phase of the dispersion.

The organoelement compound can preferably be an organometallic compound. Regardless, however, the organometallic compound has one metal atom which is selected from the following elements: Al, B, Be, Bi, Ca, Ce, Cr, Cu, K, Fe, Ga, Ge, In, Li, Mg, Mn, Mo, Na, Sn, Sr, Ta, Ti, V, Co, Ni, Zn, Rb, Sr, Nb, Ru, Rh, Pd, Ag, Cd, In, Sb, Cs, Ba, La, Hf, Ta, Re, Os, Ir, Au, Tl, Pb, Po, W, Y, Pt, and/or Zr. The organometallic compound preferably includes Fe, Pt, Zr, or Y. The same can preferably be a complex organometallic compound. The complexing agents can be selected from the group containing carbonyl-, alkyl-, alkylidene- or combinations of the same.

The organometallic compound can preferably be an organic salt, the anion of which is derived from organic acids. The same can preferably be the salts of carboxylic acids, such as, by way of example, acetates, palmitates and citrates, the salts of organic sulfates, such as lauryl sulfate, the salts of oxalic acid (oxalates), salts of tartaric acid (tartrates), salts of lactic acid (lactates), salts of gluconic acid (gluconate), salts of fumaric acid (fumarate), or the salts of alcohols (alkoxides), such as ethanolate, by way of example.

In addition, amines—the organic derivatives of ammonia $(NH_3)$—can be used.

The solidifying composition preferably includes compounds, in solution, in which an organic moiety or an organic compound is directly bonded to a metal atom. The solidifying composition is preferably liquid. The solidifying composition is preferably a solution of a solvent and components dissolved therein. In this way, it is possible to ensure that the printing head does not become clogged.

The organometallic compound is preferably selected such that, following a thermal treatment above 400° C., and preferably above 1000° C., the organic components transition to the gas phase and the metal ions—depending on the atmosphere used—react to form metal oxides, carbides, nitrides, or carbon nitrides.

The organometallic compound preferably has 1 to 3 metal atoms and 1 to 3 ligands or organic moieties. The ligands or organic moieties in turn preferably each have, independently from each other, 1 to 10 carbon atoms. It is particularly preferred that the organometallic compound only has one metal atom. The organometallic compound is preferably liquid, or soluble, at 20° C. and 1 bar. The organometallic compound is preferably soluble in water, without also decomposing within 2 hours.

In the context of the invention, the organometallic compound can also include one or more organometallic compounds. It can therefore also preferably be a mixture of multiple organometallic compounds. The organometallic compound is therefore particularly selected from among one or more of the following compounds (ordered by the metal). Any combinations of the following substances and components which are reasonable for a person skilled in the art are hereby disclosed:

Lithium (Li): butyllithium, lactic acid lithium salt, lithium acetate, lithium acetate dihydrate (acetic acid lithium salt), lithium acetoacetate (acetic acid lithium salt), lithium acetylacetonate (Li (acac)), lithium acetylide ethylene diamine complex, lithium aluminum hydride tetrahydrofuran complex solution (in toluene), lithium aluminum tri-tetr.-butyloxyhydride, lithium aluminum tris-[(3-ethyl-3-pentyl)-oxy] hydride solution (in THF), lithium 9-borabicyclo[3.3.1] nonane hydride solution (in TFT), lithium tert-butoxide solution, lithium carbonate, lithium citrate hydrate (citric acid trilithium salt hydrate), lithium dibutyl-(isopropyl) magnesate, lithium dicyclohexylamide, lithium diethylamide, lithium diisobutyl-tert-butoxy aluminum hydride solution (in tetrahydrofuran and hexane), lithium diisopropylamide solution (in THF/heptane/ethylbenzene), lithium diisopropylamide mono THF complex solution (in cyclohexane), lithium (dimethylamino)-trihydroborate solution (in THF), lithium diphenylphosphide solution (in THF), lithium ethoxide (in ethanol and THF), lithium formate monohydrate (lithium salt of formic acid), lithium methoxide, lithium 2-methyl-2-butoxide solution (in heptane), lithium morpholinoborhydride solution (THF), lithium palmitate, lithium phenoxide solution (in THF), lithium phenylacetylide solution (in THF), lithium pyrrolidinoborohydride solution (in THF), lithium salicilate, lithium tetramethylcyclopentadienylide, lithiumtetraphenyl borate tris-(1, 2-dimethoxyethane), lithium 2-thienylcyanocuprate solution (in THF), lithium thiophenolate solution (the lithium salt of thiophenol in THF), lithium p-toluene sulfinate, lithium-tert-butoxy aluminum deuteride, lithium trifluoroacetate, lithium trifluoromethane sulfonate, lithium triisobutyl-(2,2,6,6 tetramethylpiperidino) aluminate solution (in THF), lithium trimethylsilanolate (in methylene chloride), lithium trimethylsilylacetylide solution (in THF);

Sodium (Na): sodium acetates, sodium acetate trihydrate, sodium acetate solution; sodium 4 amino salicylate dihydrate, sodium L-ascorbate, sodium benzoate, sodium benzenesulfinate, sodium benzenesulfonate, sodium benzyloxide solution (in benzyl alcohol), sodium bicarbonate, sodium biphenyl complex, sodium bis(2-ethylhexyl-d17)-sulfosuccionate, sodium bis(trimethylsilyl) amide, sodium bis(trimethylsilyl) amide solution (in THF and toluene), sodium bitartrate (tartaric acid monosodium salt), sodium 2-bromoethane sulfonate, sodium 1-butanesulfonate, sodium 1-butanethiolate, sodium tert-butoxide solution (in THF), sodium tert-butoxide, sodium butyrate, sodium carbonates, sodium carbonate monohydrate, sodium carbonate decahydrate, sodium chloroacetate, sodium 2-chloroethane sulphonate monohydrate, sodium 2-chloropropionate, sodium cholate hydrate (cholic acid sodium salt), sodium citrate dibasic sesquihydrate, sodium citrate monobasic, sodium citrate tribasic dihydrate, sodium citrate tribasic hydrate, sodium cobalt carborane, sodium cyanate, sodium N-cyclohexylsulfamate, sodium cyclopentadienylide, sodium 1-decane sulfonate, sodiumdichloroacetate, sodium dichloroisocyanurate, sodium dicyanamide, sodium 2'-dicyclohexylphosphino-2,6-dimethoxy-1,1'-biphenyl-3-sulfonate hydrate, sodium diethyldithiocarbamate trihydrate, sodium diformylamide, sodium-2,3-dimercaptopropane sulfonate monohydrate, sodium dimethyldithiocarbamate, sodium dimethyldithiocarbamate solution, sodium diphenylamine-4-sulfonate, sodium 1-dodecane sulfonate, sodium dodecylbenzene sulfonate, sodium dodecyl sulfate, sodium dodecyl sulfate d25 sodium salt, sodium 1,2-ethane disulfonate, sodium ethanethiolate, sodium ethoxide, sodium ethoxide solution (in ethanol), sodium 2-ethylhexanoate, sodium 2-ethylhexyl sulfate, sodium formiate, sodium fumarate dibasic, sodium glyoxylate monohydrate, sodium 1-heptane sulfonate monohydrate, sodium 1-hexadecane sulfonate, sodium-1,1,1,5,5,5-hexafluoroacetylacetonate, sodium 1-hexane sulfonate monohydrate, sodium 4-hydroxybenzoate, sodium 2-hydroxybutyrate, sodium-(S)-3-hydroxybutyrate sodium salt, sodium 2-hydroxyethoxy-d4-acetate-d2, sodium hydroxymethane sulfinate hydrate, sodium iminodiacetate dibasic hydrate, sodium iminodiacetate dibasic acid monohydrate, sodium iodoacetate, sodium isopropylcyclopentadienide, sodium isovalerate-1-13C, sodium lactate, sodium lactate solution, sodium malonate dibasic, sodium malonate dibasic monohydrate, sodium mesoxalate monohydrate, sodium methane sulfinate, sodium methane sulfonate, sodium methane thiolate, sodium methane thiosulfonate, sodium methoxide, sodium methoxide solution (in methanol) of sodium 3-methyl-2-oxobutyrate, sodium 3-methyl-2-oxovalerate, sodium-4-methyl-2-oxo-valerate, sodium 2-methyl-2-propanethiolate, sodium methylsulfate sodium salt, sodium 4-methylvalerate-1-13C, sodium myristylsulfate, sodium 1-naphthalenesulfonate, sodium 2-naphthalene sulfonate, sodium-3-nitrobenzoate, sodium nitromalonaldehyde monohydrate, sodium 1-nonane sulfonate, sodium octanoate, sodium 1-octanesulfonate, sodium octylsulfate, sodium oleate, sodium oxalate, sodium-2-oxobutyrate, sodium 2-oxohexanoate sodium salt, sodium pentamethylcyclopentadienylide solution (in THF), sodium 1-pentane sulfonate, sodium 1-pentane sulfonate monohydrate, sodium tert-pentoxide, sodium tert-pentoxide solution (in THF), sodium percarbonate, sodium phenolate trihydrate, sodium phenylpyruvate, sodium 1-propane sulfonate monohydrate, sodium 2-propane sulfonate monohydrate, sodium 1-propane thiolate, sodium 2-propane thiolate, sodium propionates, sodium pyruvate, sodium rhodizonate dibasic, sodium salicylate, sodium styrene 4-sulfonate sodium salt hydrate, sodium succinate dibasic hexahydrate, sodium succinate dibasic, sodium L-tartrate dibasic dihydrate, sodium tetraethylborate, sodium tetrakis [3,5-bis (trifluoromethyl) phenyl] borate, sodium tetrakis (4-fluorphenhyl) borate dihydrate, sodium tetrakis-(1-imidazolyl) borate, sodium tetraphenylborate, sodium thiocyanate, sodium thioglycolate, sodium thiomethoxide, sodium thiomethoxide solution (in water), sodium p-toluene sulfinate, sodium p-toluene sulfinate hydrate, sodium p-toluene sulfonate, sodium triacetoxyborohydride, sodium trichloroacetate, sodium triethylborohydride solution (in THF and toluene), sodium trifluoroacetate, sodium trimethoxyborohydride, sodium trimethylacetate hydrate, sodium trimethylsilanoate, sodium trimethylsilanoate solution, sodium 4-vinylbenzene sulfonate, sodium vinylsulfonate solution (in water), sodium xylolsulfonate solution (in water);

Potassium (K): potassium acetate, potassium 4-acetylphenyltrifluoroborate, potassium allyltrifluoroborate, potassium antimony (III) oxide L-tartrate hydrate, potassium antimonyl-tartrate trihydrate, potassium benzoate, potassium 2-benzofuranyl trifluoroborate, potassium benzofurazan-5-trifluoroborate, potassium benzothiophen-2-yl-2-trifluoroborate, potassium [4-(benzylamino-1-carbonyl)-phenyl]-trifluoroborate, potassium 4-(benzyloxy)-phenyltrifluoroborate, potassium benzyltrifluoroborate, potassium carbonate, potassium 3,5-bis(trifluoromethyl)-phenyltrifluoroborate, potassium bis(trimethylsilyl)amide, potassium bis(trimethylsilyl)amide solution??? (in THF and toluene), potassium 1-(Boc)-1H-indol-2-trifluoroborate, potassium (bromomethyl) trifluoroborate, potassium 4-bromophenyltrifluoroborate, potassium trans-3-bromo-1-propenyltrifluoroborate, potassium-2-bromopyridine-3-trifluoroborate, potassium 6-brompyridine-3-trifluoroborate, potassium 5-bromothiophenyl-2-trifluoroborate, potassium (2Z)-2-buten-2-yltrifluoroborate, potassium tert-butoxide, potassium tert-butoxide solution (in tert-butanol and THF), potassium butylaminomethyltrifluoroborate, potassium 4-tert-butylphenyltrifluoroborate, potassium butyltrifluoroborate, potassium carbonate, potassium carbonate-sodium carbonate mixture, potassium 3-carboxyphenyltrifluoroborate, potassium 4-carboxyphenyltrifluoroborate, potassium 4 chlorophenyltrifluoroborate, potassium 2-chloropyridine-3-trifluoroborate, potassium 5-chloropyridine-3-trifluoroborate, potassium 6-chloropyridine-3-trifluoroborate, potassium N-chloro-p-toluene sulfonamide, tribasic potassium citrate tribasic monohydrate, potassium cyanate, potassium 4-cyclohexyl butyrate, potassium cyclopentyltrifluoroborate, potassium cyclopropyltrifluoroborate, potassium 2-(3, 5-di-tert-butyl-2-hydroxybenzylideneamino)-2,2-dip-enyl acetate, potassium dichloroacetate, potassium gold cyanide, potassium [4-(diethylamine-1-carbonyl)-phenyl]trifluoroborate, potassium 2,4-difluorophenyltrifluoroborate, potassium 2,6-difluorophenyltrifluoroborate, potassium 2,6-dimethoxyphenyltrifluoroborate, potassium (N,N-dimethylaminomethyl)-trifluoroborate, potassium 4-(N,N-dimethylamino)-phenyltrifluoroborate, potassium (3,3-dimethybutyl))-trifluoroborate, potassium [4-(N,O-dimethylhydroxylaminocarbonyl)phenyl]-trifluoroborate, potassium 2,6-dimethylphenyltrifluoroborate, potassium 2,5-dimethylthiophene-3-trifluoroborate, potassium diphenylphosphide solution, potassium methoxide, potassium methoxide solution, potassium ethyltrifluorocarbonate, potassium methylxanthogenate, potassium 2-fluoro-5 formylphenyltrifluoroborate, potassium 3-fluorophenyltrifluoroborate, potassium 4-fluorophenyltrifluoroborate, potassium 6-fluoropyridine-3-trifluoroborate, potassium formate, potassium d-formate, potassium 3-formilphenyltrifluoroborate, potassium 4-formilphenyltrifluoroborate, potassium 2-furantrifluoroborate, potassium furan-3-trifluoroborate, potassium gold (III) chloride, potassium hydrogen phthalate, potassium hydrogen tartrate monobasic, potassium 4-(hydroxymethyl)-phenyltrifluoroborate, potassium 3-hydroxyphenyltrifluoroborate, potassium indigotetrasulfonate, potassium indigotrisulfonate, potassium 2-iodo-5-methylbenzene sulfonate, potassium-(iodomethyl)-trifluoroborate, potassium 4-iodophenyltrifluoroborate, potassium ionophore II, potassium 2-isocyanoacetate, potassium isopropenyltrifluoroborate, potassium isopropentrifluoroborate, potassium methanesulfonate, potassium methoxide, potassium solution, potassium 2-methoxyphenyltrifluoroborate, potassium 4-methoxyphenyltrifluoroborate, potassium trans-3-methoxy-1-propenyltrifluoroborate, potassium 2-methoxypyridine-3-trifluoroborate, potassium 2-methoxypyridine-5-trifluoroborate, potassium 3-methyl-2-buten-2-yltrifluoroborate, potassium 3,4-(methylenedioxy)-phenyltrifluoroborate, potassium (4-methyl-1-piperazinyl)-methyltrifluoroborate, potassium 2-methyl-1-propenyltrifluoroborate, potassium 5-methyl-2-thiophentrifluoroborate, potassium methyltrifluoroborate, potassium 4-(morpholine-4-carbonyl)-phenyltrifluoroborate, potassium 2-naphtalintrifluoroborate, potassium sodium tartrate tetrahydrate, potassium nitrate, potassium (2-nitrophenyl)-trifluoroborate, potassium 3-nitrophenyltrifluoroborate, potassium octyltrifluoroborate, potassium oleate, potassium oxalate monohydrate, potassium α-oxo-7-azzaindol-3-acetate, potassium palmitate, potassium palmitate potassium salt, potassium pentamethylcyclopentadienylide, potassium tert-pentoxide solution, potassium phenylmethymethyl, potassium [4-(phenylaminomethyl) phenyl]trifluoroborate, potassium (phenylethynyl)-trifluoroborate, potassium phenylethyltrifluoroborate, potassium phenyltrifluoroborate, potassium phtalate monobasic, potassium 1H-pyrazol-3-trifluoroborate, potassium pyridine-3-trifluoroborate, potassium 4-pyridintrifluoroborate, potassium pyrimidine-5-trifluoroborate, potassium rhodizonate, potassium sec-butyltrifluoroborate, potassium trans-styryltrifluoroborate, dibasic potassium tartrate hemihydrate, potassium tetrabromoaurate (III) hydrate, potassium 1-(tetrahydro-2H-pyran-2-yl)-1-H-pyrazol-4-trifluoroborate, potassium tetrakis(4-chlorophenyl) borate, potassium tetrakis(2-thienyl) borate, potassium tetraphenylborate, potassium thioacetate, potassium thiocyanate, potassium 2-thiophenetrifluoroborate, potassium 3-thiophenetrifluoroborate, potassium titanoxide oxalate dihydrate, potassium p-toluene thiosulfonate, potassium o-toluenetrifluoroborate, potassium p-toluenetrifluoroborate, potassium triethylborhydride solution, potassium trifluoroacetate, potassium 2-(trifluoromethyl)-phenyltrifluoroborate, potassium 4-(trifluoromethyl)-phenyltrifluoroborate, potassium trimethylsilanolate, potassium trioxalatochromium (III) trihydrate, potassium triphenylborohydride solution (in THF), potassium vinyltrifluoroborate;

Rubidium (Rb): rubidium carbonate, rubidium nitrate, rubidium tetraphenylborate;

Cesium (Cs): cesium acetate, cesium bicarbonate, cesium carbonate, cesium formate, cesium methane sulfonate, cesium nitrate, cesium oxalate, cesium pivalate (cesium trimethylacetate), cesium tetraphenylborate;

Beryllium (Be): beryllium nitrate solution, beryllium acetate

Magnesium (Mg): magnesium citrate, magnesium ethylate, magnesium gluconate, magnesium nitrate, magnesium acetate, magnesium acetylacetonate (Mg (acac)), magnesium bis(diisopropyl) amide solution, magnesium bis(hexamethyldisilazide), magnesium bis(monoperoxyphtalate) hexahydrate, magnesium bromide ethyletherate, magnesium chloride triethylamine solution (in methanol), magnesium di-tert-butoxide, lactic acid magnesium salt, magnesium methoxide solution (in methanol), magnesium methyl carbonate solution (dimethylformamide), magnesium monoperoxyphtalate, magnesium phthalocyanine, magnesium stearate (stearic acid magnesium salt), magnesium trifluoromethane sulfonate;

Calcium (Ca): calcium acetate monohydrate, calcium acetate hydrate, calcium acetylacetonate hydrate, calcium L-ascorbate dihydrate, calcium carbonate, calcium citrate tetrahydrate, calcium 2-ethylhexanoate, calcium D-gluconate monohydrate, calcium α-D-heptagluconate hydrate, calcium isopropoxide, calcium L-lactate hydrate, calcium ethylate, calcium nitrate hydrate, calcium nitrates, calcium oxalate, calcium oxalate monohydrate, calcium oxalate hydrate, calcium propionate, calcium 2,2,6,6-tetramethyl-3,5-heptanedionate, calcium thiocyanate tetrahydrate;

Strontium (Sr): strontium acetate hydrate; strontium acetylacetonate, strontium carbonate, strontium isopropoxide, strontium nitrate, strontium oxalate, strontium-tetramethylheptanedionate;

Barium (Ba): barium nitrate, barium acetate, barium acetyl acetonate, barium tert-butoxide, barium carbonate, barium 2-cyanethylphosphate hydrate, barium diphenylamine-4-sulfonate, barium 2-ethylhexanoate, barium isopropoxide, barium 2,2,6,6-tetramethyl-3,5-heptanedionate hydrate; barium thiocyanate, barium trifluormethane sulfonate;

Scandium (Sc): scandium (III) acetate hydrate, scandium acetylacetone hydrate, scandium isopropoxide, scandium (II) nitrate hydrate, scandium (III) (2,2,6,6-tetramethyl-3,5-heptanedionate) hydrate;

Yttrium (Y), yttrium nitrate, yttrium (III) acetate, yttrium (III) acetylacetonate (Y (acac)), yttrium (III) butoxide solution (in toluene), yttrium (III) carbonate hydrate, yttrium (III) 2-ethyl hexanoate, yttrium (III) isopropoxide (in toluene), yttrium (III) isopropoxide oxide, yttrium (III) 2,2,6,6-tetra-methyl-3,5-heptanedionate, yttrium fluoroacetate, yttrium (III) trifluoroacetate, yttrium trifluoromethane sulfonate;

Lanthanum (La): lanthanum acetate hydrate, lanthanum (III) acetylacetonate hydrate, lanthanum (III) carbonate hydrate, lanthanum (III) isopropoxide, lanthanum (III) nitrate hydrate, lanthanum (III) oxalate hydrate, lanthanum trifluoromethane sulfonate, lanthanum trifluoromethane sulfonate hydrate;

Titanium (Ti): titanium acetylacetonate, tetraethylorthotitanate, tetrapropylorthotitanate, titanium (IV) bis(ammonium-lactato) dihydride solution, titanium (IV) butoxide, titanium (IV) tert-butoxide, titanium (III) chloride tetrahydrofuran complex, titanium (IV) chloride tetrahydrofuran complex, titanium diisopropoxide bis(acetylacetonate), titanium (IV) ethoxide, titanium (IV) 2-ethylhexyloxide, titanium (IV) isopropoxide, titanium (IV) methoxide, titanium (IV) oxide acetylacetonate (TiO (acac), titanium (IV) phthalocyanine dichloride, titanium (IV) propoxide, titanium (IV) (triethanolaminato) isopropoxide solution, titanylphthalocyanine, Zirconium (Zr): zirconium acetate solution (in acetic acid), zirconium (IV) acetylacetonate, zirconium acrylate, zirconium (IV) bis(diethyl citrato) dipropoxide, zirconium bromonorbornenelactone carboxylate triacrylate, zirconium (IV) butoxide, zirconium (IV) tert-butoxide, zirconium (IV) carbonate basic, zirconium carboxyethylacrylate (in n-propanol), zirconium (IV) chloride tetrahydrofuran complex, zirconium (IV) ethoxide, zirconium (IV) isopropoxide isopropanol complex, zirconium (IV) propoxide solution (in N-propyl alcohol), zirconium (IV) 2,2,6,6-tetramethyl-3,5-heptanedionate, zirconium (IV) trifluoroacetylacetonate;

Hafnium (Hf): hafnium (IV) n-butoxide, hafnium (IV) tert-butoxide, hafnium carboxyethylacrylate, hafnium (IV) chloride tetrahydrofuran complex, hafnium isopropoxide isopropanol adduct, hafnium (IV) trifluoromethane sulfonate hydrate;

Vanadium (V): vanadium (III) acetylacetonate, vanadium (III) chloride tetrahydrofuran complex, vanadium (V) oxytriethoxide, vanadium (V) oxytriisopropoxide, vanadium (V) oxytripropoxide, vanadyl acetylacetonate, vanadyl 2,3-naphthalocyanine, vanadyl 2,11,20,29-tetra-tert-butyl-2,3-naphthalocyanine, vanadyl-2,3,10,17,24-tetra-tert-butyl-1,8,15,22-tetrakis(dimethylamino)29H,31H-phthalocyanine, vanadyl-2,9,16,23-tetraphenoxy-29H,31H-phthalocyanine;

Niobium (Nb): niobium (V) ethoxide;

Tantalum (Ta): tantalum (V) butoxide, tantalum (V) ethoxide, tantalum (V) methoxide;

Chromium (Cr): chromium (II) acetate monohydrate, chromium (III) acetate, chromium (III) acetylacetonate (Cr (acac) 3), chromium (III) chloride THF complex, chromone, chromium 3-carboxylic acid, chromotrope (dyes);

Molybdenum (Mo): molybdenum (II) acetate dimer, molybdenum hexacarbonyl, molybdenyl acetylacetonate;

Tungsten (W): tungsten hexacarbonyl;

Manganese (Mn): manganese (II) acetate, manganese (II) acetate tetrahydrate, manganese (III) acetate dihydrate, manganese (II) acetylacetonate, manganese (III) acetylacetonate, manganese bis(trifluoromethanesulfonate), manganese (II) carbonate, manganese (II) carbonate hydrate, manganese carbonyl; manganese (II) formate hydrate, manganese (II)-1,1,1,5,5,5-hexafluoroacetylacetonate trihydrate, manganese (II) nitrate hydrate, manganese (II) phthalocyanine, manganese (III) phthalocyanine chloride;

Rhenium: methylrhenium (MTO), rhenium complexes.

Iron (Fe): iron citrate, iron fumarate, iron gluconate, ammonium iron citrate, ammonium iron sulfate, iron (II) acetate, iron (II) acetylacetonate, iron (III) acetylacetonate, iron (II) ethylene diammonium tetrahydrate, iron (II) fumarate, iron (II) lactate hydrate, iron (II) oxalate dihydrate, iron (III) oxalate hexahydrate, iron (o)-pentacarbonyl, iron phthalocyanine, iron (III)-2,2,6,6-tetra-methyl-3,5-heptanedionate, iron (III) p-toluenesulfonate hexahydrate, iron (II) trifluoromethane sulfonate;

Ruthenium (Ru): ruthenium (III) acetylacetonate;

Osmium: osmium complex compounds;

Cobalt (Co): cobalt (II) acetate, cobalt (II) acetylacetonate, cobalt (III)-acetylacetonate, cobalt (II) benzoylacetonate, cobalt (II) carbonate hydrate, cobalt carbonyl, cobalt (II) cyanide dihydrate, cobalt (II) 2-ethylhexanoate solution (in mineral spirits), cobalt (II) 1,2,3,4,8,9,10,11,15,16, 17,18, 22,23,24,25-hexadecafluoro-29H,31H-phthalocyanine, cobalt (II)-1,1,1,5,5,5-hexafluoroacetylacetonate hydrate, cobalt (II) 2,3-naphthalocyanine, cobalt napthenate, cobalt (II) oxalate dihydrate, cobalt (II) phthalocyanine; cobalt (II) thiocyanate;

Rhodium (Rh): rhodium (II) acetate dimer, rhodium (III) acetylacetonate, rhodium (II) heptafluorobutyrate dimer, rhodium (II) hexanoate dimer; rhodium (II) octanoate dimer, rhodium (II) trifluoroacetate dimer, rhodium (II) trimethylacetate dimer, rhodium (II) triphenylacetate dimer;

Iridium (Ir): iridium acetylacetonate;

Nickel (Ni): nickel (II) acetate tetrahydrate, nickel (II) acetylacetonate, nickel (II) bromide diethylene glycol dimethyl ether complex, nickel (II) bromide dimethoxyethane complex, nickel (II) carbonate basic tetrahydrate, nickel (II) carbonate basic hydrate; nickel chloride dimethoxyethane adduct, nickel (II) 4-cyclohexylbutyrate, nickel (II) 2-ethylhexanoate, nickel (II)-1,1,1,5,5,5-hexafluoroacetylacetonate hydrate, nickel (II) 1,4,8,11,15,18,22,25-octabutoxy-29H,31H-phthalocyanine, nickel (II) 5,9,14,18,23,27,32,36-octabutyloxy-2,3-naphthalocyanine, nickel (II) octanoate hydrate, nickel (II) oxalate dihydrate, nickel (II) phthalocyanine, nickel (II) phthalocyanine tetrasulfonic tetrasodium salt, nickel (II) 2,2,6,6-tetramethyl-3,5, heptanedionate;

Palladium (Pd): palladium (II) acetate, palladium (II) acetylacetonate, palladium (II) [1,3,-bis(diphenylphosphino) propane] bis(benzonitrile)-bis-tetrafluoroborate, palladium (II) chloride diacetonitrile complex, palladium (π-cinnamyl)-chloride dimer, palladium (II) hexafluoroacetylacetonate, palladium pivalate, palladium propionate, palladium (II) tetrafluoroborate tetraacetonitrile complex, palladium (II) tetrafluouroacetate;

Platinum (Pt): platinum (II) acetylacetonate, platinum (II) platinum octaethylporphyrin, chloroplatinic (IV) acid;

Copper (Cu): copper (I, II) acetate, copper (II) acetate 1,2-bis-diphenylphosphino)ethane, copper (II) acetylacetonate (Cu (acac) 2), copper bis(6,6,7,7,8,8,8-heptafluoro-2,2-dimethyl-3,5-octanedionate, copper (I) bromide dimethylsulfide complex, copper (II) tert-butylacetoacetate, copper (II) 4-cyclohexylbutyrate, copper (II) carbonate basic, copper (II) 3,5-diisopropylsalicylate hydrate, copper 2-[(diphenylphosphino)benzylideneamino]-3,3-dimethylbutyrate, trisodium triflate] complex, dimer, copper (II) 2-ethylhexanoate, copper (II) formate hydrate (formic acid copper (I) salt hydrate), copper (II)-D-gluconate, copper (II) 1,2,3,4,8,9,10,11,15,16,17,18,22,23,24,25-hexadecafluoro-29H,31H phthalocyanine, copper (II) 1,1,1,5,5,5-hexafluoroacetylacetonate hydrate, copper iodide dimethylsulfide complex, copper (II) methoxide, copper (I) 3-methylsalicylate, copper (II) 2,3-naphthalocyanine, copper (II) 1,4,8,11, 15,18,22,25-octabutoxy-29H,31H-phthalocyanine, copper (II) 5,9,14,18,23,27,32,36-octabutyloxy-2,3-naphthalocyanine, copper (II) 2,3,9,10,16,17,23,24-octakis(octyloxy)-29H,31H-phthalocyanine, copper (II) phthalocyanine, copper phthalocyanine-3,4', 4", 4'''-tetrasulfonic acid tetrasodium salt, copper (II) phthalocyanine tetrasulfonic tetrasodium salt, copper (II) tartrate (tartaric acid copper (I) salt), copper (II) 4,4', 4", 4''' tetraaza-29H,31H-phthalocyanine, copper (II)-2,9,16,23-tetra-tert-butyl-29H,31H-phthalocyanine, copper 2,2,6,6-tetramethyl-3,5-heptane dionate, copper (I) thiophene-2-carboxylate, copper (II) trifluoroacetate, copper (II) trifluoroacetylacetonate, copper (II) trifluoromethane sulfonate, copper (II) trifluoromethane sulfonate benzene complex, copper (II) trifluoromethanesulfonate toluene complex;

Silver (Ag): silver acetate, silver (I) acetylacetonate, silver benzoate, silver bis(trifluoromethanesulfonyl) imide, silver carbonate, silver citrate hydrate, silver cyanate, silver 4-cyclohexylbutyrate, silver diethyldithiocarbamate, silver heptafluorobutyrate, silver lactate, silver methane sulfonate, silver pentafluoro propionate, silver (II) picolinate, silver (I) sulfadiazine, silver p-toluene sulfonate, silver trifluoroacetate, silver thiocyanate, silver trifluoromethane sulfonate, Gold (Au): auranofin, sodium aurothiomalate;

Zinc (Zn): zinc acetates, zinc acetylacetonate hydrate, zinc acrylate, zinc-70 Zn-L-aspartate, zinc bis(2,2,6,6-tetramethyl-3,5-heptanedionate), zinc chloride tetrahydrofuran complex, zinc citrate tribasic dihydrate, zinc-di-bis(trifluoromethylsulfonyl)imide, zinc-3,5-di-tetr-butylsalicylate; zinc diethyldithiocarbamate, zinc dimethyldithiocarbamate, zinc-70 Zn glyconate, zinc-1,2,3,4,8,9,10,11,15,16,17,18, 22,23,24,25-hexadecafluoro-29H,31H-phthalocyanine, zinc hexafluoroacetylacetonate dihydrate, zinc methacrylate, zinc methoxide, zinc naphthenate, zinc 1,4,8,11,15,18,22, 25-octabutoxy-29H,31H phthalocyanine; zinc 2,3,9,10,16, 17,23,24-octakis-29H,31H-phthalocyanine, zinc oxalate hydrate, zinc phthalocyanine, zinc stearate, zinc-2,11,20,29-tetra-tert-butyl-2,3-naphthalocyanine, zinc-2,9,16,23-tetrahydro-tert-butyl-29H,31H-phthalocyanine, zinc (II) tetranitrophthalocyanine, zinc p-toluenesulfonate hydrate, zinc trifluoroacetate hydrate, zinc trifluoromethanesulfonate, zinc undecylenate;

Cadmium (Cd): cadmium acetate hydrate, cadmium acetate dihydrate, cadmium acetylacetonate hydrate, cadmium carbonate, cadmium nitrate tetrahydrate;

Mercury (Hg): mercury (II) acetate, mercury (I) nitrate dihydrate, mercury (II) nitrate monohydrate, mercury (II) nitrate solution (in water), mercury (II) tetrathiocyanatocobaltate (II), mercury (II) thiocyanate, mercury (II) trifluoroacetate, mercury (II) trifluoromethanesulfonate, mercury (II) fulminate;

Boron (B): organoboranes, organoboronic acid, and organoboronic acid esters, 9-borabicyclo [3.3.1]nonane solution (in hexane fraction, in THF), 9-borabicyclo [3.3.1]nonane dimer, borabicyclo [3.3.1]nonyltrifluorosulfonate solution (in hexane fraction), boramers (poly-[(2,5-didecycloxy-1,4-phenylene)-(2,4,6-triisopropylphenylborane)] biphenyl-terminated), borane ammonia complex, borane tert-butylamine complex, borane di-tert-butylphosphine complex, borane N,N-diethylaniline complex, borane N,N-diisopropylethylamine complex, borane dimethylamine complex, borane dimethylsulfide complex, borane dimethyl sulfide complex solution (in diethyl ether, methylene chloride, THF, toluene), borane diphenylphosphine complex, borane N-methylmorpholine complex, borane morpholine complex, borane pyridine complex, borane tetrahydrofuran complex solution (in THF), borane THF complex d3-solution (in THF), borane triethylamine complex, borane trimethylamine complex, borane triphenylphosphine complex, 4-borono-D-phenylalanine, 4-borono-L-phenylalanine 4-borono-DL-phenylalanine, boron trifluoride methanol d4 complex, boron subphthalocyanine chloride, boron tribromide solution (in heptane, hexane fraction, methylene chloride), boron trichloride solution (in toluene, heptane, hexane fraction, methylene chloride, α-xylene), boron trichloride dimethyl sulfide complex, boron trichloride dimethylsulfide complex solution (in methylene chloride), boron trifluoride acetonitrile complex solution, boron trifluoride tert-butylmethyletherate, boron trifluoride dibutyl ether complex, boron trifluoride diethyletherate, boron 10B trifluoride diethyl ether complex, boron trifluoride dimethylsulfide complex, boron trifluoride acetic acid complex, boron trifluoride ethylamine complex, boron trifluoridine methanol, boron trifluoride methanol complex solution, boron trifluoride methyletherate, boron trifluoride tetrahydrofuran complex, boron tris (trifluoroacetate) solution;

Phosphorus (P): phosphazene base P2-t-Bu-solution (in THF), phosphazene base P4-t-Bu solution (in hexane), phosphazene base P1-t-Bu-tris(tetramethylene), phosphazene base P2-Et, phosphazene base P1-t-Oct, phosphazene base P4-t-Oct solution (in hexane), phosphocholine chloride calcium salt tetrahydrate, phosphoenol pyruvic acid cyclohexylamine salt, phosphoenolpyruvate monopotassium salts, phosphanoformic acid trisodium salt, 2-phosphano butyric acid triethylester, 4-phosphonocrotonic acid triethylester, (12-phosphonododecyl) phosphonic acid, phosphonoacetic acid, phosphonoacetic acid P,P-bis(2,2,2-trifluoroethyl) methyl ester, phosphonoacetic acid P,P-dimethyl-tert-butyl ester, phosphonoacetic acid P,P-dimethylethyl ester, phosphonoacetic acid triethylesters, phosphonoacetic acid trimethyl ester, 16-phosphonohexadecanoic acid, 6-phosphonohexanoic acid, N-(phosphonomethyl) glycine, N-(phosphonomethyl_glycine monoisopropylamine salt solution, N-(phosphonomethyl)iminodiacetic acid hydrate, 8-phosphonooctyl phosphonic acid, 4-phosphonooxy-TEMPO(-2,2,6,6-tetramethyl-1-piperidinyloxy), 3-phosphonopropionic acid, 2-phosphono-propionic acid triethyl ester, 3-phosphonopropionic acid, 3-phosphono-propionic acid triethyl ester, 11-phosphonoundecanoic acid, phosphoric bis(dimethylamide) chloride, phosphoric acid cyclopropylmethyldiethyl-esters, phosphoric acid dichloride dimethylamide, phosphoricacid diethyl-3-butenyl ester, phosphoric acid diphenyl ester azide, phosphoric acid diphenylchloride;

Aluminum (Al): aluminum acetate basic, aluminum acetylacetonate (Al (acac) 3), aluminum butoxide, aluminum tert-butoxide, aluminum sec-butoxide, aluminum sec-butoxide solution (in methylene chloride), aluminum chloride THF complex, aluminum ethoxide, aluminum isopropoxide, aluminum-L-lactate, aluminum monostearate, aluminum 2,3-naphthalocyanine chloride, aluminum phenolate, aluminum phthalocyanine hydroxide, aluminum tetrakis-(4-chlorophenyl) porphine-bis-tetrahydrofuran-tetracarbonylcobaltate, aluminum 1,8,15,22-tetrakis(phenylthio)-29H,31H-phthalocyanine chloride, aluminum 2,2,6,6-tetramethyl-3,5-heptanedionate;

Gallium (Ga): gallium (III) acetylacetonate, gallium (III) nitrate hydrate, gallium (III) phthalocyanine chloride;

Indium (In): indium (III) acetate, indium (III) acetate hydrate, indium (III) acetylacetonate, indium (III) nitrate hydrate, indium (III) phthalocyanine chloride, indium (III) trifluoromethane sulfonate, indium (III) tris-(trifluoromethane sulfonimide);

Thallium (Tl): thallium (I) acetate, thalium (III) acetate, thalium (I) acetylacetonate, thallium (I) carbonate, thallium (I) ethoxide, thallium (I) formate, thallium (I) nitrate, thallium (I) nitrate trihydrate, thallium (III) trifluoroacetate;
Silicon (Si): silicon 2,3-naphthalocyanine dichloride, silicon 2,3-naphthalocyanine dihydroxide, silicon phthalocyanine dichloride; silicon phthalocyanine dihydroxide, silicon tetraacetate, silicon 2,9,16,23-tetra-tert-butyl-29H,31H phthalocyanine dihydroxide;
Germanium (Ge): germanium (II) chloride dioxane complex, germanium (IV) ethoxide, germanium (IV) isopropoxide, germanium (IV) methoxide;
Tin (Sn): tin (II, IV) acetate, tin (IV) bis(acetylacetonate) bromide, tin (IV) bis(acetylacetonate) chloride, tin (IV) tert-butoxide, tin (II) 2-ethylhexanoate, tin (II) methanesulfonate solution (in water), tin (II) oxalate, tin (IV) phthalocyanine oxide, tin trifluoromethanesulfonate;
Lead (Pb): lead (II) acetate trihydrate, lead (IV) acetate, lead (II) acetylacetonate, lead (II) carbonate, lead (II) carbonate basic, lead (II) methanesulfonate solution (in water), lead phthalocyanine, lead (II) subacetate, lead (II) tetrakis-(4-cumylphenoxy)phthalocyanine;
Arsenic (As): arsenobetaine;
Antimony (Sb): antimonic acid tripropylester;
Bismuth (Bi): bismuth (III) acetate, bismuth (III) carbonate basic, bismuth (III) citrate, bismuth (III) gallate basic hydrate, bismuth neodecanoate, bismuth (III) nitrate pentahydrate, bismuth (III) salicylate basic, bismuth (III) trifluoromethane sulfonate;
Selenium (Se): seleno-L-cystine, seleno-DL-methionine methyl-13C1, selenophene;
Tellurium (Te): compounds of the form R2Te, R2Te2, R4Te and R6Te (where R is always alkyl-, aryl-moieties), diorganotellurium dihalogenides R2TeX2 (R=alkyl, aryl, X=F, Cl, Br, I) and triorganotellurium halogenides R3TeX (R=alkyl, aryl, X=F, Cl, Br, I);
Cerium (Ce): cerium (III) acetate hydrate, cerium (III) acetylacetonate hydrate, cerium (III) carbonate hydrate, cerium (III) 2-ethylhexanoate, cerium (III) nitrate hexahydrate, cerium (III) oxalate hydrate;
Praseodymium (Pr): praseodymium (III) acetylacetonate hydrate, praseodymium (III) nitrate hexahydrate, praseodymium (III) trifluoromethanesulphonate;
Neodymium (Nd): neodymium (III) acetate hydrate, neodymium (III) acetylacetonate hydrate, neodymium (III) carbonate hydrate, neodymium (III) isopropoxide, neodymium (III) nitrate hexahydrate, neodymium (III) nitrate hydrate;
Samarium (Sm): samarium (III) acetate hydrate, samarium (III) acetylacetonate hydrate, samarium (III) isopropoxide, samarium nitrate hexahydrate, samarium (III) trifluoromethanesulfonate;
Europium (Eu): Europium (III) acetate hydrate, europium (III) acetylacetonate hydrate, europium (III) nitrate pentahydrate, europium (III) nitrate hydrate, europium (III) trifluoroacetate, europium (III) trifluoromethane sulfonate, europium (III) tris(d,d-dicampholymethanate), europium (III) tris-[3-(heptafluoropropylhydroxymethylene)-(−)camphoratel, Europium (III) tris-[3-(heptafluoropropyl-hydroxymethylene)-d-camphorate], Europium (III) tris-(trifluoromethyl-hydroxymethylene)-d-camphorate];
Gadolinium (Gd): gadolinium (III) acetate hydrate, gadolinium (III) acetylacetonate hydrate, gadolinium (III) carbonate hydrate, gadolinium (III) nitrate hexahydrate, gadolinium (III) triethylenetetramine hexaacetate trisodium salt, gadolinium (III) trifluoromethanesulfonate, gadolinium (III) triisopropanolate;
Terbium (Tb), terbium (III) acetate hydrate, terbium (III) acetylacetonate hydrate, terbium (III) nitrate pentahydrate, terbium (III) nitrate hexahydrate, terbium (III) 2,2,6,6-tetramethyl-3,5-heptanedionate, terbium (III) trifluoromethane sulfonate;
Dysprosium (Dy): dysprosium (III) acetate hydrate, dysprosium (III) nitrate hydrate, dysprosium (III) trifluoromethanesulfonate;
Holmium (Ho): holmium (III) acetate hydrate, Holmium (III) nitrate pentahydrate, holmium (III) trifluoromethanesulfonate,
Erbium (Er): erbium (III) acetate hydrate, erbium (III) acetylacetonate hydrate, erbium (III) nitrate pentahydrate, erbium (III) 2,2,6,6-tetramethyl-3,5-heptanedionate, erbium (III) trifluoromethanesulphonate;
Thulium (Tin): thulium (III) acetate hydrate, thulium (III) nitrate pentahydrate, thulium (III) trifluoromethanesulfonate;
Ytterbium (Yb): ytterbium (III) acetate hydrate, ytterbium (III) isopropoxide, ytterbium (III) nitrate pentahydrate, ytterbium (III) trifluoromethanesulfonate, ytterbium (III) trifluoromethanesulfonate hydrate;
Lutetium (Lu): lutetium (III) acetate hydrate, lutetium (III) acetylacetonate hydrate, lutetium (III) nitrate hydrate, lutetium (III) trifluoromethanesulfonate;
Tungsten (W): tungsten hexacarbonyl; and/or
Actinium (Ac): actinium (III) oxalate.

It is hereby noted that, in the case of rhenium, methylrhenium trioxide (MTO) is soluble in water and organic solvents. Rhenium complexes, both with single metal centers and as metal clusters, are preferred. Here, rhenium-rhenium multiple bonds can occur, in some cases also in the form of triple or quadruple bonds. A quadruple bond exists, for example, in the Re2X82 complex ion (X in this case is a halogen atom or a methyl group).

In the 3D printing process, the binding agent and ceramic powder can be tuned to each other. The binder must ensure that the powder particles "glue" to each other, and the green body acquires sufficient solidity. When the solidifying composition is applied, by way of example with a printing head, it must not run, and must exactly form the given contour. For this, it is necessary that the solidifying composition reacts with few particles in the powder bed in a short time. The fraction of the organic additives should preferably be so small that no separate unbinding process is necessary. The goal is to be able to sinter the "printed" green body immediately after removal from the powder bed.

The solidifying composition preferably contains dissolved binding agent, particularly selected from the group containing dextrin, maltodextrin, starch derivatives, cellulose, polyvinyl alcohol, polyvinyl alcohol, polyvinyl pyrrolidone, polyethylene glycol, sugar, sugar derivatives, or any combinations of the aforementioned substances.

To ensure the dimensional accuracy of the component, it is important to know the exact shrinkage and to take this into account as a tolerance value in the CAD model for the printing process.

It is an essential goal that the finished prototypes have material properties like those expected in the series production. Density in particular is one of these values. In order to implement a compaction, it is possible to infiltrate the green body in a further step and thereby achieve a closed surface.

Observance of tolerances and the reproducibility of the geometry are critically important for the production process. Ceramic components produced by means of 3D printing have a reproducibility of ±10 μm. Even the formation of steps along curved surfaces, for relevant methods, lies within this order of magnitude.

An aspect of the invention seeks to place dispersions which contain organometallic compounds or colloids in a component made of a powder, at a microscopic level, in such a manner that a ceramic structure is created following the sintering which has varying properties with respect to chemical composition, phase composition, and/or grain size in precisely defined regions. In this way, it is possible to configure a ceramic component with a structure having local property variations matched to the specific load conditions.

It is also possible to not use any binding agent. In this case, there is the advantage that fewer organic impurities are present in the resulting ceramic mold, as long as organic dispersing agent is used and has low porosity.

Water or an organic dispersing agent or a mixture of the same is preferably selected as the dispersing agent. In particular, the fraction of water in the dispersing agent is at least 50% by weight. As such, it is possible to avoid too great an amount of organic residues remaining and leading to carbon impurities during the sintering. Alcohols, ketones, or polyethers are used as the organic dispersing agent, by way of example.

In a method according to an certain embodiment the invention, a layer thickness for the ceramic powder, and optionally the binding agent, is advantageously selected in a range of 10 to 300 μm, and particularly 50 to 120 μm. If a smaller layer thickness is selected, the method would slow down excessively. On the other hand, if the layer thickness is selected too far above the range, the molding precision drops significantly. In addition, the surface roughness would increase as a result of the formation of step effects.

A powder of the oxide, silicide, nitride and/or carbide of the elements Al, B, Bi, Ca, Ce, Cr, Cu, K, Fe, Ga, Ge, In, Li, Mg, Mn, Mo, Na, Si, Sn, Sr, Ta, Ti, W, Y and/or Zr, or mixtures thereof, is preferably used. It is particularly preferred that aluminum oxide, silicon oxide, or a mixed oxide of these oxides is used as the powder, particularly silicates such as feldspar. Similarly included in the scope of the invention are also mixed oxides of the previously named oxides, such as mixed nitrides, mixed carbides, carbonitrides, oxynitrides, or oxycarbides of the elements named above. These ceramic materials have proven to be particularly suitable for certain embodiments according to the invention. The ceramic powder preferably has a grain size within a range of 0.1 to 500 μm, and particularly in a range of 1 to 100 μm. This avoids excessively high surface roughness in the later mold, on the one hand, and on the other hand likewise prevents contamination by absorption on the high BET surface when grains are too small.

The ceramic powder is preferably used in an amount of 85 to 100% by weight. In this way, the content of ceramic material is nevertheless sufficiently high to provide enough play for, by way of example, the optionally present binding agent.

The binding agents, in turn, are preferably selected from among saccharides, arabic gum, resin, cellulose linen, wax, casein, epoxy resin, polyurethane, or mixtures thereof. In particular, the binding agent is selected from the group including starches, sugars, and/or dextrin. It has been shown that these binding agents have a high compatibility with ceramic materials, and also generate the fewest undesired ceramic contaminations in the resulting molds.

The binding agent is preferably used in a volume of 1 to 15% by weight. Below 1% by weight, it loses its effect. Above 15% by weight, it leads to too many undesired organic contaminations in the green body and/or in the mold.

The binding agent preferably has a grain size in a range of 0.1 to 500 μm, and particularly in a range of 5 to 30 μm.

If articles should be produced by embodiments according to the invention, which have an overhang relative to the wetted part of the first layer (for example, a sphere), then the layer dimension of the first layer is preferably selected such that it has the maximum expansion of the resulting green body.

The substrate within the context of the invention is not part of the green body for the first layer, and for the following layers [the substrate] is the respective, previous layer. The substrate onto which the first layer is formed is preferably selected from plastic and/or metal. The layer is formed, by way of example, by applying the powder to the substrate or the previously formed layer and then leveling the applied powder, for example, by passing a straight object over the applied powder at a spacing from the previous layer or the substrate, said spacing corresponding to the desired layer thickness, thereby removing excess powder.

The solidifying composition is advantageously applied by means of a printing head of an ink jet printer, a microdispenser, a microdoser, a piezo printing head, or a freely-programmable dosing system. In this way, it is possible to significantly simplify the method by using standard components from other application fields.

Additives such as surfactants, dispersants, pH adjustors, emulsifiers, suspending agents, defoamers, preservatives, drying delay agents, additives for controlling rheological properties, wetting agents, antioxidants, UV absorbers, light stabilizers or a combination thereof can be contained in the solidifying composition, by way of example. These additives are included, by way of example, in a volume within a range of 0.05 to 2% by weight.

The viscosity of the solidifying composition is advantageously no greater than 105 mPas·s, and preferably no greater than 50 mPas·s, at 20° C. and 1 bar. It is particularly preferred that the viscosity is in a range of 1 to 100 mPas·s, and preferably 5 to 50 mPas·s, at 20° C. and 1 bar. The viscosity can be measured with a Brookfield CAP 1000+ viscometer with the CAP-S-01 spindle, at a rotational speed of 750 rev/min.

The surface tension of the solidifying composition advantageously lies in a range of 20 to 70 mN/m, and preferably 30 to 40 mN/m, at 20° C. and 1 bar. The surface tension can be determined in accordance with DIN 55660-3:2011-12.

In step c), steps a) and b) are preferably repeated at least 50 times, and particularly at least 100 times, so that the step effects on the surface, which are inherently always present in these methods, are minimized to the greatest possible extent.

The removal of the dispersing agent, particularly the water, is performed by drying, for example. In this case, the duration of the removal of the dispersing agent can be in a range from 8 to 48 hours, for example. The temperature in this case is, by way of example, in a range of 15 to 150° C., and particularly in a range of 30 to 80° C. The atmosphere in which the removal of the dispersing agent is performed is, by way of example, air. During the removal of the dispersing agent, a stream of the atmosphere can be conveyed by a ventilator, by the application of a vacuum, or by convection. Depending on the ceramic powder used, a hydrate sheath, or other compounds, is formed by the dispersing agent, such that the dispersing agent is very difficult to remove entirely. For this reason, in the context of the invention, the removal of the dispersing agent is considered complete when no further outflow of dispersing agent can be observed toward the end of the drying—that is, the weight remains substantially constant.

The unbonded ceramic powder is removed by shaking or blowing, by way of example.

For the application of the solidifying composition, a nozzle opening is selected, for example, in a range of 10 to 100 µm, and independently thereof, a drop size is in a range of 5 to 100 µm. Because of the drop size according to the invention, it is possible to wet the surface of the ceramic powder particularly evenly.

The additional solidifying composition is mixed with the first solidifying composition immediately before the application thereof. This can occur in a print head of an ink jet printer, by way of example.

The method according to the invention is therefore suitable for producing a 3D structure design of a ceramic mold which can have a very flexible form. As such, the ceramic molds can be given highly variable properties with locational accuracy. This is possible as a result of the fact that any concentrations of highly variable materials can be positioned very precisely in the ceramic mold. Highly variable element distributions can be positioned in a targeted manner. These variable element compounds can be applied to the layer with the ceramic powder, in embodiments according to the invention, in the same work step—for example from different tanks, with the same print head, or from different print heads.

The method according to the invention is moreover also suited not only to the production of prototypes, but also for use in series production.

In embodiments according to the invention, a 3D model of the green body can first be made in a computer, by way of example. This model can then be divided in the computer into slices, the thickness of which correspond to the intended layer thickness of the ceramic powder. In the process it is possible to control, using color gradients, by way of example, which of the optionally different tanks with solidifying composition discharges the composition to the print head. By way of example, the tank which contains blue ink in a conventional ink jet printer can contain a solidifying composition containing titanium tetrachloride solution. In a further tank, a solution of copper citrate can be loaded as the solidifying composition, said tank typically containing yellow ink. Using a computer, it is now possible to define a gradient from blue to yellow over the mold in the 3D model, for example. If this data is then transmitted to the printer, a green body results which leads to a mold which on one side of the gradient is, by way of example, photocatalytically active, and on the other side of the gradient is particularly heat-conductive, wherein there is a fluid transition in-between through these properties.

For this purpose, a powder prepared by means of spray granulation, for example, is mixed with an organic binding agent—by way of example potato starch—and fed to a Z-510 Printer (Z Corporation, USA). Using water-based binder solution (ZB54, Z-Corporation), which is applied via an ink jet print head, it is possible to construct the component being produced in layers and according to the CAD data. Following the printing process, the parts are dried and blown clean, for example, then finally sintered.

The Z-310 printer is typically used to produce colored cement models. For this purpose, it is equipped with 4 colors, corresponding to an ink jet printer. In place of colored binding agent, it can be contemplated that, by way of example, dispersions are used which have different metal organic compounds. In this way, the base $Al_2O_3$ powder can be sprayed in variable amounts, by way of example, with the different compositions. There are typically three color chambers available in the printer. By filling with solutions of organometallic compounds or colloidal dispersions, it is possible to print the desired composite or mixed oxide ceramics on a micron scale, up to a millimeter scale. Pursuant to an aesthetic specification, iron citrate, for example, can be sprayed in darkly colored regions. In this region, a material is formed during the sintering which has significantly higher iron oxide components.

By way of example, it is also possible to specifically lay electrical conductor pathways in three dimensions in ceramic molds by adding chloroplatinic (IV) acid to the solidification solution. In this way, it is possible to produce customized heating elements, for example, if the remaining ceramic material is selected to be an insulator.

The problem addressed by the invention is solved in a further embodiment by a green body which is produced according to the method according to the invention.

In a further embodiment, the problem addressed by the invention is solved by a method for the production of a ceramic mold, wherein the method according to the invention is first carried out and then the green body is sintered.

In this case, the sintering temperature is selected, by way of example, in a range between 1000 and 2000° C.; and depending on the same, the hold time is selected within a range of 0.5 to 10 hours, particularly 1 to 4 hours.

In a further embodiment, the problem addressed by the invention is solved by a ceramic mold which has been produced according to the method according to the invention.

The mold has, by way of example, a porosity in a range of 0 to 60%, and particularly preferably in the range of 0 to 20%. Regardless of the same, the ceramic mold has a modulus of elasticity in a range of 100 to 400 GPa. Again regardless thereof, the ceramic mold has a tensile strength in the range of 150 to 400 MPa.

The mold according to embodiments the invention is preferably selected from the group including a tooth replacement, structural ceramic, functional ceramic, and/or a sintered ceramic carrier for complex circuits.

In the case of a tooth replacement, the technology according to the invention has the advantage, by way of example, that a continuous color profile, customized coloring, and natural appearance can be achieved according to a model of real teeth.

In the case of structural ceramic, it is possible to achieve a local structure modification or structure strengthening: for example an increase in the tensile strength thereof (for example using $ZrO_2$ in $Al_2O_3$), an increase in the durability under temperature variation (for example mullite in corundum), for example an increase in heat conductivity (for example AlN in $Al_2O_3$), for example a local variation in the density or porosity, or for example a variation of the pore size for a selective filtration of gases or liquids.

In the case of functional ceramic, it is possible to achieve an integration of electrical, magnetic, or inductively conducting structures in insulating components, or the integration of actuators or sensors in multi-functional components.

It is possible to produce complex circuits on the basis of sintered ceramic carriers. In contrast to common LTCC technology, wherein multi-layer circuits are produced by printing (screen printing) ceramic films, it is possible by means of the method according to the invention to produce conductor paths, capacitors, resistors, and coils in any arbitrary 3-dimensional arrangement.

Embodiment Example

An aluminum oxide powder (CT3000SG, Almatis, Ludwigshafen, Germany) was prepared by means of fluidized bed granulation (GPCG, Glatt, Dresden, Germany). The granules were sieved to <150 μm and then mixed with 7% by mass of potato dextrin powder, with a grain size of 115 μm (Superior Gelb F, Südstärke, Schrobenhausen, Germany).

10% by mass iron citrate (F6129-250G, Sigma-Aldrich Chemie, Taufkirchen, Germany) was added to the water-based binding agent solution (ZB54, Z Corporation, USA). The components were mixed in a beaker using a magnetic stirrer for 5 minutes.

Rod-shaped elements (1 cm×1 cm×5 cm) were created by means of a CAD program for the purpose of working up a sample. These had a color gradient from one end of the bar to the other (yellow to blue). The data set was converted by the 3D printer (Z-510, Z-Corporation, USA). The layer thickness was adjusted to 0.088 mm, and the saturation to maximum.

A pure binder solution (ZB 54) was loaded into a binding agent tank, and the mixture of the binder solution with iron citrate was loaded into the second. The two binding agents were applied to the powder bed in varying proportions according to the color gradient during the printing process.

The printed samples were dried at room temperature in the powder bed of the 3D printer for 12 hours. Next, the sample element were removed and fully dried in a drying cabinet at 60° C. for a further 12 hours. Then the sample elements were freed of unbonded powder by means of a brush and pressurized air.

The sample elements were sintered at 1600° C. for a hold time of 2 hours.

The invention claimed is:

1. A method for producing a green body, the method comprising:
    forming a layer which contains a powder of a ceramic on a substrate;
    applying at least one solidifying composition on at least a part of the layer, wherein the at least one solidifying composition contains:
        at least 0.01 to 99.98% by weight of a dissolved or liquid organometallic compound, the dissolved or liquid organometallic compound having at least one atom which is not C, Si, H, O, or N, and the at least one atom being bonded to at least one organic moiety,
        0.01 to 20% by weight of an organic binding agent, and
        0.01 to 99.98% by weight of solvent or dispersing agent;
    repeating forming the layer and applying at least one solidifying composition at least one time;
    removing the solvent or dispersing agent at least in part to form a green body; and
    removing the powder which has not bonded and, thereby, exposing the green body.

2. The method according to claim 1, wherein the layer also contains binding agent.

3. The method according to claim 1, wherein water or an organic dispersing agent is selected as the dispersing agent.

4. The method according to claim 1, wherein a layer thickness of the powder and the binding agent is in the range of 10 to 300 μm.

5. The method according to claim 4, wherein the layer thickness of the powder and the binding agent is in the range of 50 to 120 μm.

6. The method according to claim 1, wherein the powder is an oxide, silicide, nitride, and/or carbide of the elements Al, B, Bi, Ca, Ce, Cr, Cu, K, Fe, Ga, Ge, In, Li, Mg, Mn, Mo, Na, Si, Sn, Sr, Ta, Ti, W, Y, and/or Zr, or mixtures of the same.

7. The method according to claim 1, further comprising sintering the green body.

8. The method according to claim 1, wherein the solidifying composition is liquid.

9. The method according to claim 8, wherein the solidifying composition contains only liquid.

* * * * *